US011159753B2

United States Patent
Wang et al.

(10) Patent No.: US 11,159,753 B2
(45) Date of Patent: Oct. 26, 2021

(54) HIGH DYNAMIC RANGE OPTICAL SENSING DEVICE EMPLOYING BROADBAND OPTICAL FILTERS INTEGRATED WITH LIGHT INTENSITY DETECTORS

(71) Applicant: Coherent AI LLC, Redwood City, CA (US)

(72) Inventors: Xingze Wang, Durham, NC (US); Xin Lei, San Carlos, CA (US); Yibo Zhu, Redwood City, CA (US)

(73) Assignee: Coherent AI LLC, Redwood City, CA (US)

( * ) Notice: Subject to any disclaimer, the term of this patent is extended or adjusted under 35 U.S.C. 154(b) by 322 days.

(21) Appl. No.: 16/391,915

(22) Filed: Apr. 23, 2019

(65) Prior Publication Data

US 2020/0344430 A1    Oct. 29, 2020

(51) Int. Cl.
*H04N 5/355* (2011.01)
*H04N 5/235* (2006.01)
*H04N 5/72* (2006.01)

(52) U.S. Cl.
CPC ....... *H04N 5/35536* (2013.01); *H04N 5/2355* (2013.01); *H04N 5/35509* (2013.01); *H04N 5/72* (2013.01)

(58) Field of Classification Search
CPC ............. H04N 5/35536; H04N 5/2355; H04N 5/35509; H04N 5/72; H04N 5/2254; H04N 5/238; G02B 5/201; G02B 5/207; H01L 27/14621; H01L 27/14603
See application file for complete search history.

(56) References Cited

U.S. PATENT DOCUMENTS

| | | |
|---|---|---|
| 3,732,793 A | 5/1973 | Tague |
| 5,510,215 A * | 4/1996 | Prince .................... G02B 5/201 359/359 |
| 2003/0178549 A1 | 9/2003 | Ray |

(Continued)

OTHER PUBLICATIONS

International Search Report in the parent PCT application No. PCT/US2019/028783, dated Oct. 15, 2019.

(Continued)

*Primary Examiner* — Michael E Teitelbaum
(74) *Attorney, Agent, or Firm* — Chen Yoshimura LLP

(57) ABSTRACT

A high dynamic range image sensors enabled by integrating broadband optical filters with individual sensor pixels of a pixel array. The broadband optical filters are formed of engineered micro or nanostructures that exhibit large differences in transmittance, e.g. up to 5 to 7 orders of magnitude. Such high transmittance difference can be achieved by using a single layer of individually designed filters, which show varied transmittance as a result of the distinct absorption of various material and structures. The high transmittance difference can also be achieved by controlling the polarization of light and using polarization-sensitive structures as filters. With the presence of properly designed integrated nanostructures, broadband transmission spectrum with transmittance spanning several orders of magnitude can be achieved. This enables design and manufacturing of image sensors with high dynamic range which is crucial for applications including autonomous driving and surveillance.

7 Claims, 13 Drawing Sheets

(56) References Cited

U.S. PATENT DOCUMENTS

| | | | |
|---|---|---|---|
| 2003/0223532 A1 | 12/2003 | Clinthorne et al. | |
| 2008/0186491 A1* | 8/2008 | Baxter | G01D 5/3473 356/364 |
| 2010/0277607 A1 | 11/2010 | Choi et al. | |
| 2012/0169972 A1* | 7/2012 | Jung | G02F 1/133528 349/96 |
| 2013/0250150 A1 | 9/2013 | Malone et al. | |
| 2014/0267884 A1 | 9/2014 | Shen et al. | |
| 2015/0350583 A1* | 12/2015 | Mauritzson | H04N 5/374 250/208.1 |
| 2016/0171710 A1 | 6/2016 | Emery | |
| 2016/0255289 A1 | 9/2016 | Johnson et al. | |
| 2017/0347042 A1 | 11/2017 | Borthakur et al. | |

OTHER PUBLICATIONS

Written Opinion in the parent PCT application No. PCT/US2019/028783, dated Oct. 15, 2019.

Nayar et al., "High dynamic range imaging: spatially varying pixel exposures", Proceedings IEEE Conference on Computer Vision and Pattern Recognition, CVPR 2000 (Cat. No PR00662), Jun. 15, 2000.

Mannami et al., "High Dynamic Range Camera using Reflective Liquid Crystal", 2007 IEEE 11th International Conference on Computer Vision, Oct. 14-21, 2007.

Yoon et al., "Broadband Epsilon-Near-Zero Perfect Absorption in the Near-Infrared", Scientific Reports, vol. 5, Article No. 12788, 2015.

Lei, "Ultra-broadband absorber from visible to near-infrared using plasmonic metamaterial", Optics Express, pp. 5686-5693, vol. 26, No. 5, Mar. 5, 2018.

Wang et al., "Absorption Enhancement in Ultrathin Crystalline Silicon Solar Cells with Antireflection and Light-Trapping Nanocone Gratings", NANO Letters, 2012, 12 (3), pp. 1616-1619.

Guillaumée et al., "Polarization sensitive silicon photodiodes using nanostructured metallic grids", Applied Physics Letters, 94, 193503, 2009.

Hirakawa et al., "Adaptive homogeneity-directed demosaicing algorithm", IEEE Transactions on Image Processing', vol. 14, Issue 3, Mar. 2005, pp. 360-369.

* cited by examiner

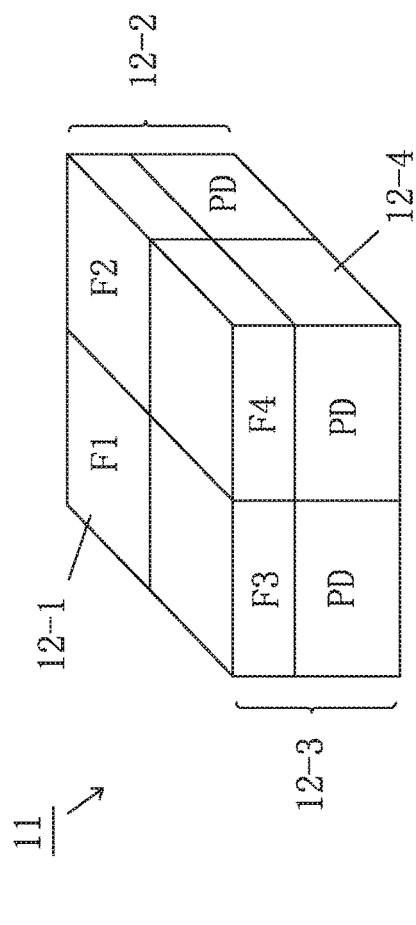
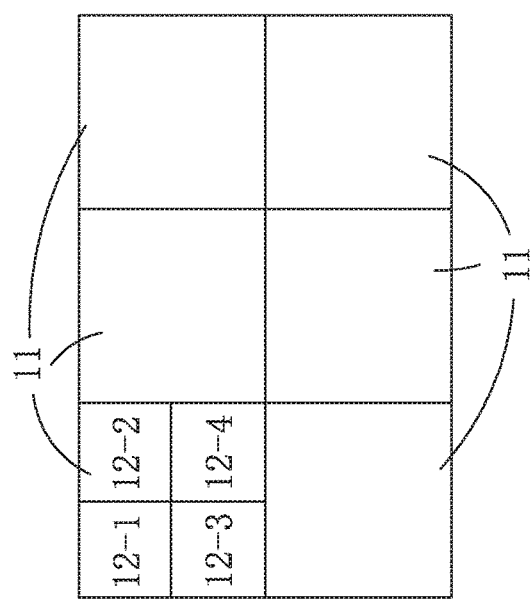
Fig. 1(a)
Fig. 1(b)

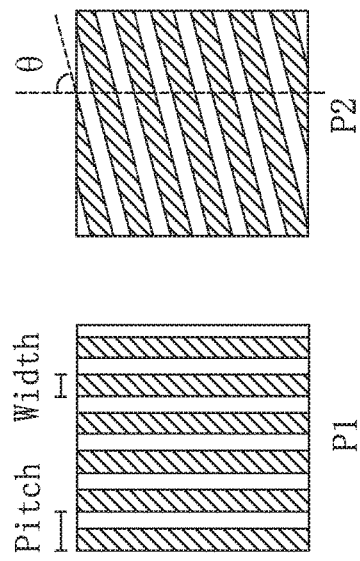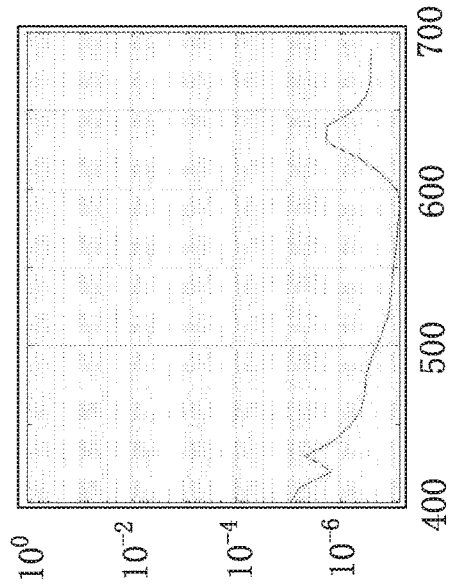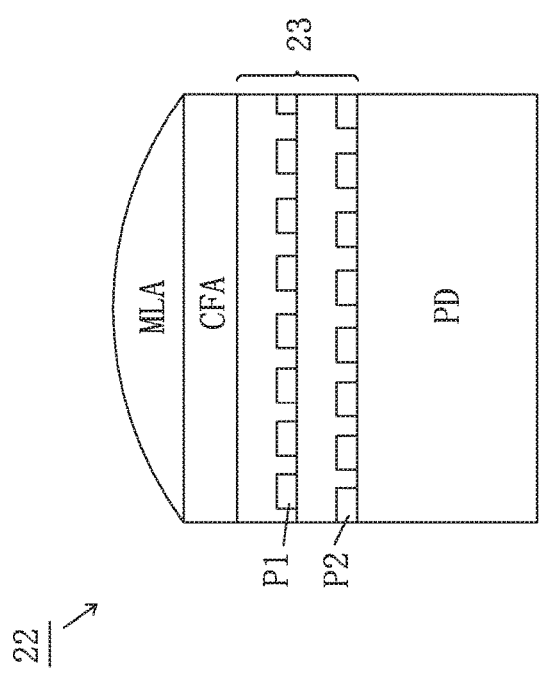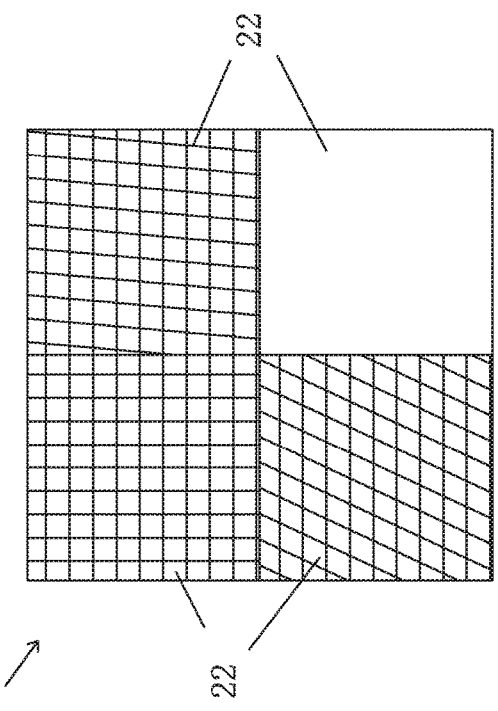

Fig. 10

HIGH DYNAMIC RANGE OPTICAL SENSING DEVICE EMPLOYING BROADBAND OPTICAL FILTERS INTEGRATED WITH LIGHT INTENSITY DETECTORS

BACKGROUND OF THE INVENTION

Field of the Invention

This invention relates to optical sensing devices, and in particular, it relates to optical sensing devices for high dynamic range imaging which employ broadband optical filters integrated with light intensity detectors.

Description of Related Art

Image sensors with high dynamic range is crucial for many applications, such as autonomous driving and surveillance, where light intensities from the scenes often have extremely high variability. Due to the limited dynamic range of most conventional image sensors, images captured for such scenes often have areas of overexposure and/or underexposure.

Conventional high dynamic range (HDR) image processing methods involve capturing multiple images at different exposure levels for the same scene, applying data processing algorithms to the image data to identify regions in the individual images that are overexposed or underexposed, and then merging the multiple images together to create an HDR image where all regions have proper exposure levels.

S. K. Nayar et al., High dynamic range imaging: spatially varying pixel exposures, Proceedings IEEE Conference on Computer Vision and Pattern Recognition, CVPR 2000 (Cat. No. PR00662), 15 Jun. 2000, describes "a very simple method for significantly enhancing the dynamic range of virtually any imaging system. The basic principle is to simultaneously sample the spatial and exposure dimensions of image irradiance. One of several ways to achieve this is by placing an optical mask adjacent to a conventional image detector array. The mask has a pattern with spatially varying transmittance, thereby giving adjacent pixels on the detector different exposures to the scene. The captured image is mapped to a high dynamic range image using an efficient image reconstruction algorithm. The end result is an imaging system that can measure a very wide range of scene radiance and produce a substantially larger number of brightness levels, with a slight reduction in spatial resolution." (Abstract.)

H. Mannami et al., High Dynamic Range Camera using Reflective Liquid Crystal, 2007 IEEE 11th International Conference on Computer Vision, 14-21 Oct. 2007, describes "a method to improve the dynamic range of a camera by using a reflective liquid crystal. The system consists of a camera and a reflective liquid crystal placed in front of the camera. By controlling the attenuation rate of the liquid crystal, the scene radiance for each pixel is adaptively controlled. After the control, the original scene radiance is derived from the attenuation rate of the liquid crystal and the radiance obtained by the camera. A prototype system has been developed and tested for a scene that includes drastic lighting changes. The radiance of each pixel was independently controlled and the HDRIs were obtained by calculating the original scene radiance from these results." (Abstract.)

SUMMARY

The present invention is directed to a high dynamic range image sensor and related method that substantially obviates one or more of the problems due to limitations and disadvantages of the related art.

An object of the present invention is to provide high dynamic range image sensor that is easy to fabricate using conventional semiconductor processing techniques.

Additional features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve the above objects, the present invention provides a high dynamic range image sensor, which includes: a plurality of spatial pixels forming an array, wherein each spatial pixel includes a plurality of detector pixels disposed adjacent to each other, each detector pixel including a light intensity detector, wherein in each spatial pixel, at least some of the detector pixels each have a broadband optical filter disposed above the respective light intensity detector, and wherein each spatial pixel either includes at least one detector pixel without any broadband optical filter and at least one detector pixel with a broadband optical filter, or includes at least two detector pixels with respective broadband optical filters that have different transmittances, wherein each broadband optical filter includes a nanostructure formed of one or more layers of semiconductor, metal, and/or dielectric material and is integrated with the corresponding light intensity detector.

In another aspect, the present invention provides a high dynamic range image sensor, which includes: a plurality of pixels forming an array, each pixel including a light intensity detector and a broadband optical filter disposed above and integrated with the light intensity detector, wherein the broadband optical filter includes two wire grid polarizers and a liquid crystal layer disposed between the two wire grid polarizers, wherein each wire grid polarizer includes a patterned layer of metal or semiconductor covered by a dielectric layer, the patterned layer including a set of straight wires disposed parallel to each other and extending in a defined orientation; a liquid crystal drive circuit configured to apply an electric field to the liquid crystal layer of each pixel, wherein in response to the electric field, the liquid crystal layer rotates a polarization direction of the light passing through it to change a transmittance of the broadband optical filter; and a control circuit configured to generate control signals for the drive circuit.

It is to be understood that both the foregoing general description and the following detailed description are exemplary and explanatory and are intended to provide further explanation of the invention as claimed.

BRIEF DESCRIPTION OF THE DRAWINGS

FIGS. 1(a) and 1(b) schematically illustrate a high dynamic range image sensor according to embodiments of the present invention.

FIGS. 2(a)-2(d) schematically illustrate a high dynamic range image sensor employing double-layer wire grid polarizers integrated with photodiodes according to a first embodiment of the present invention.

FIG. 10 schematically illustrates a pixel arrangement for a high dynamic range image sensor according to an embodiment of the present invention.

DETAILED DESCRIPTION OF PREFERRED EMBODIMENTS

Figure 3C:
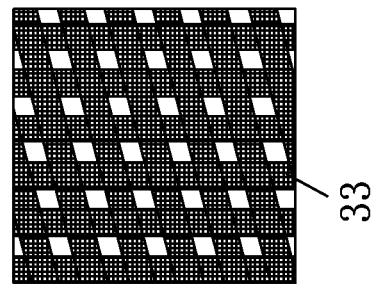
FIGS. 3(a)-3(c) schematically illustrate a high dynamic range image sensor employing single layer wire grid filters integrated with photodiodes according to a second embodiment of the present invention.

Embodiments of the present invention provide high dynamic range (HDR) image sensors formed by integrating broadband optical filters (also referred to as broadband optical attenuators, neutral density filters) with individual light intensity detectors. The light intensity detectors may be, for example, CMOS (complementary metal-oxide-semiconductor) image sensors, CCD image sensors, etc. The descriptions below use CMOS sensors as an example. The broadband optical filters integrated on the light intensity detectors are formed of engineered micrometer scale structures or nanometer scale structures that exhibit large differences in light transmittance among different filters integrated with different light intensity detectors, e.g. up to 5 to 7 orders of magnitude difference. Such high difference in transmittance can be achieved by using a single layer of individually designed filters, which have various transmittance values as a result of the distinct absorption of various material and structures of the filter. The high difference in transmittance can also be achieved by controlling the polarization of light and using polarization-sensitive structures as the filters. With the presence of properly designed integrated micro or nanostructures, broadband transmission spectrum with transmittance spanning several orders of magnitude can be achieved. This enables design and manufacturing of image sensors with high dynamic range which is crucial for applications including autonomous driving and surveillance.

In this disclosure, the broadband optical filters are referred to as being "integrated" with the corresponding light intensity detectors, as the filters are formed by semiconductor fabrication processes directly on the light intensity detectors and are monolithically integrated with the light intensity detectors.

To describe the structure of the high dynamic range image sensor, two levels of pixels are defined here: spatial pixel and detector pixel. A detector pixel is a single photocurrent generating unit, for example a photodiode, with its associated transistors and circuitry in a CMOS sensor. Each detector pixel may have an optical filter with a specific transmittance integrated on top of the CMOS sensor, or have no filter and therefore detect the unattenuated light intensity. A spatial pixel is a set of multiple adjacent detector pixels where the filter structure (and therefore the transmittance) for each detector pixel may be different. The spatial pixels tile the whole image sensor periodically. Combining the output from all spatial pixels with algorithms such as demosaicing generates reconstruction of high dynamic range images.

FIGS. 1(a) (perspective view) and 1(b) (plan view) schematically illustrate a high dynamic range image sensor 10 formed of an array spatial pixels 11, each spatial pixel including multiple detector pixels 12-1, 12-2, etc. Each detector pixel includes a CMOS sensor ("PD") and an broadband optical filter ("F1", "F2", etc.) or no filter over the sensor. The filters may have different transmittance. The following embodiments focus on the design of the filters within each spatial pixel.

The first to seventh embodiments of the present invention and their variations employ broadband filters based on nanostructures formed of metal, semiconductor and/or dielectric and integrated with the light intensity detectors.

FIGS. 2(a)-2(c) schematically illustrate a high dynamic range image sensor using wire grid polarizers as broadband optical filters according to a first embodiment of the present invention. FIG. 2(a) is a cross sectional view of one detector pixel 22, which includes a light intensity detector PD and a broadband optical filter 23. The broadband optical filter 23 includes two wire grid polarizers P1 and P2 integrated directly on the light intensity detector PD in a stack. Each wire grid polarizer P1, P2 is formed by a patterned layer of metal or semiconductor with a dielectric layer covering the metal or semiconductor layer. Each patterned layer of metal or semiconductor includes a set of straight wires (strips) disposed parallel to each other, preferably in a periodic structure. The orientations of the metal or semiconductor wires of the two wire grid polarizers P1 and P2 are at a predefined angle relative to each other (see FIG. 2(b), plan view). The stack of two polarizers P1 and P2 form a broadband optical filter that attenuates the incident light by a factor that depends on the relative angle between the orientations of the two polarizers, from no attenuation to 100% attenuation.

Using two stacked polarizers to achieve broadband optical filters is widely known and used in large optical components, such as camera systems, to alter the overall intensity of the light reaching the image sensor. A perfect polarizer transmits 100% of linearly polarized light that is parallel to its polarization axis, and transmits 0% of linearly polarized light that is orthogonal to its polarization axis. The intensity I of the light passing through two consecutive polarizers can be described by Malus's law to the first order:

$$I = I_0 * \cos(\theta)^2$$

where $I_0$ is the incident intensity and $\theta$ is the angle between the polarization directions of the two polarizers. By aligning the two polarizers' axis to be perfectly orthogonal, the transmittance is 0. This implies a theoretical dynamic range of infinity.

In practice, however, the dynamic range of the broadband optical filters of the first embodiment is limited by the accuracy of the fabrication process, the material properties, as well as the geometry of the wire grid. With properly designed wire grid structures, it is possible to extend the dynamic range of the detector pixel by more than 100 dB in addition to that of the commercial CMOS image sensor technology for the visible light. Ideally, to achieve a perfect polarizer, the pitch of the grid and the width of the metal or semiconductor wires should be significantly smaller than the wavelength of the incident light, e.g., less than 400 nm. In practice, due to limitations imposed by the current CMOS fabrication technology, the pitch and wire width may be in the resonant regime of the incident wavelength. Resonance and surface plasmonic effect need to be taken into consideration when calculating the transmission spectrum for structure design.

Simulation result of one example of the double layer orthogonal wire grid structure is shown in FIG. 2(d). In this example, the wire grid was made of copper, which is widely used in the CMOS process as the interconnect metal layer. The two layers of copper grids were separated by a dielectric material, such as $SiO_2$, common in typical CMOS process flows. A grid pitch of 300 nm and wire width of 200 nm were used, leaving a gap of 100 nm between adjacent wires. These feature sizes are compatible with typical 0.13 um CMOS process technology. It is noted that the thickness of the dielectric material, or the vertical distance between the two metal wire layers, is not critical. Under this design, simulated transmittance down to 1e-5~1e-7 was achieved for the visible light spectrum. Different transmittance may be achieved by adjusting the relative angle of the two wire grids of polarizers P1 and P2, the width of the wires and the grid pitch, etc. Reduction of transmittance by one order of magnitude effectively extends the dynamic range of the detector by 20 dB on the higher intensity end. Therefore, an extension of dynamic range by 100 dB is possible with this technology.

In summary, a wide range of transmittance can be designed by adjusting the geometry and arrangement of the metal wire layers of polarizers P1, P2 to greatly extend the dynamic range of the image sensor, and the manufacturing processes are completely compatible with existing commercial CMOS technology.

FIG. 2(a) also show a color filter array ("CFA") and a micro lens array ("MLA") formed over the image sensor array above the broadband optical filters.

FIG. 2(c) (plan view) shows a spatial pixel 21 formed of four detector pixels 22, where three of the detector pixels each have two wire grid polarizers, the relative angles between the two polarizers being different for the three detector pixels, and one detector pixel has no wire grid. The light intensities detected by the different detector pixels will be different. Detector pixels having filters of lower attenuation or no filter will be able to image darker scene without underexposure, while pixels having filters of higher attenuation will be able to image brighter scene without overexposure.

In alternative embodiments, the number of polarizers (metal or semiconductor wire layers) may be more than two.

The above-described high dynamic range image sensor structure can also be applied to other wavelength ranges, such as IR or longer, and the parameters of the nanostructures should be adjusted accordingly. For example, for longer wavelength incident light, the pitch of the wire pattern should be made longer.

After an image sensor having multiple spatial pixels is fabricated, it may be calibrated (characterized) to measure the actual transmittance of the broadband optical filter for each detector pixel. This is because while in principle the transmittance of each detector pixel may be calculated from the known parameters of the filter structure, in practice, the actual transmittance may differ from the theoretical values due to process variation. Calibration may be performed by using a light source of relatively uniform intensity and detecting the light intensities using both the image sensor to be calibrated and a similar image sensor that has no filters.

Figure 3B:
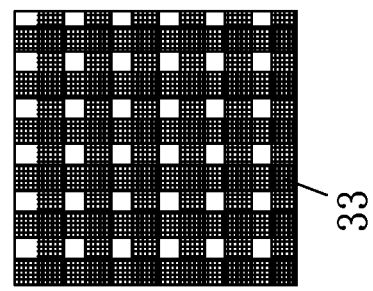
Figure 3A:
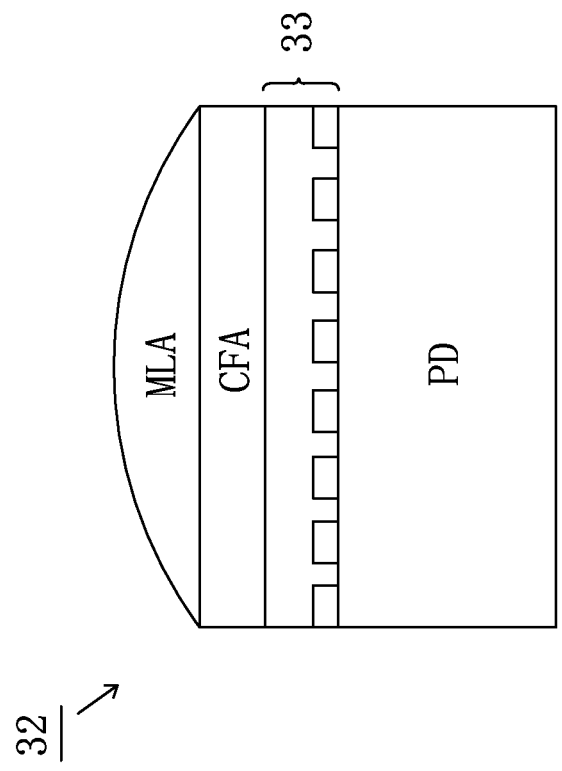

FIGS. 3(a)-3(c) illustrate a high dynamic range image sensor using a single layer wire grid as a broadband optical filter for each detector pixel according to a second embodiment of the present invention. FIG. 3(a) is a cross-sectional view showing a detector pixel 32 with the single layer wire grid 33 integrated above the light intensity detector PD, and FIG. 3(b) and FIG. 3(c) are plan views of two different examples of the single layer wire grid 33. The single layer wire grid 33 is a patterned layer of metal or semiconductor having a first set of straight wires disposed parallel to each other and a second set of straight wires disposed parallel to each other, where the orientations of the first and second sets of wires are at a predefined angle relative to each other, forming a two-dimensional wire grid. By adjusting the pitch, wire width, and relative orientation of the two sets of wires, various transmittance can be achieved. This reduces the number of required patterning steps as compared to the first embodiment (FIGS. 2(a)-2(c)), which simplifies the manufacturing process. The image sensor is formed of an array of spatial pixels, each spatial pixel including multiple detector pixels having broadband optical filters with different transmittances.

Figure 4B:
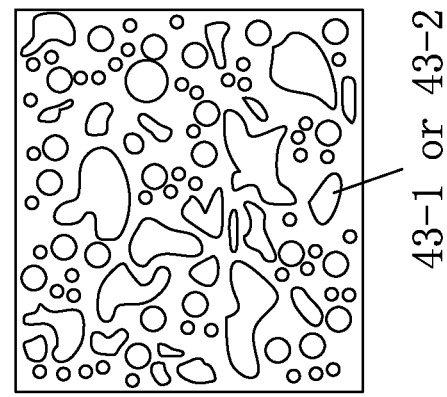
FIGS. 4(a)-4(b) schematically illustrate a high dynamic range image sensor employing single patterned layers of random shapes integrated with photodiodes according to a third embodiment of the present invention.
Figure 4A:
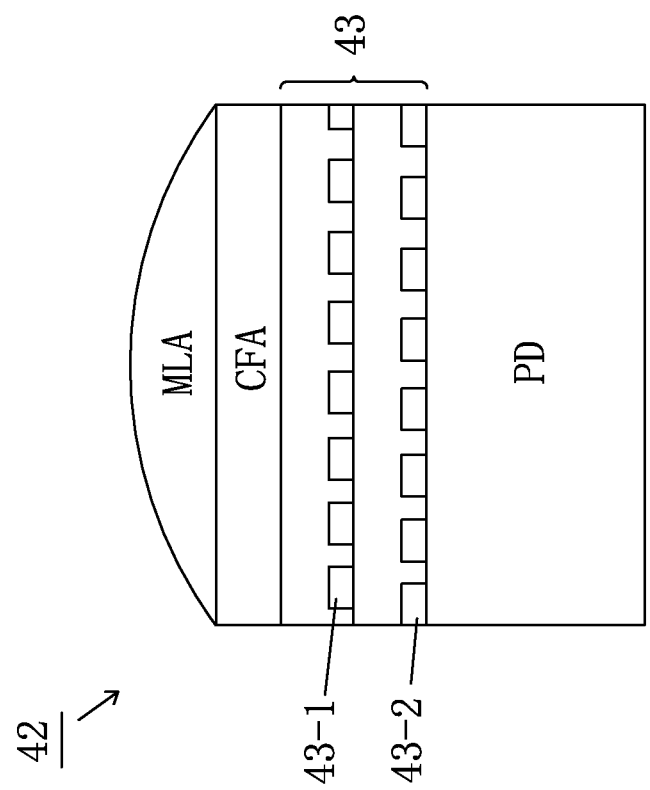

FIGS. 4(a) and 4(b) illustrate a detector pixel 42 of a high dynamic range image sensor according to a third embodiment of the present invention. The broadband optical filter 43 integrated above the light intensity detector PD includes one or more patterned layers of metal or semiconductor nanostructures, the nanostructures having feature sizes smaller than the wavelengths of the incident light (e.g., less than 400 nm) and random shapes and random 2D distributions designed to have a broadband attenuation by a factor ranging across a few orders of magnitude. Random structures are used to suppress the resonances of periodic structures and suppress the sharp peaks in the spectrum, and therefore achieve a relatively flat transmission spectrum. The transmittance of the broadband optical filter 43 is dependent on various parameters of the nanostructures, which may include: the area coverage density of the nanostructures, i.e., the total area of the nanostructures as a percentage of the total area of the filter, assuming a uniform thickness of the nanostructures; the shape and size of the nanostructures; if the nanostructures form a periodic pattern, the periodicity; etc. Multiple layers of such random nanostructures (e.g. layers 43-1, 43-2 shown in FIG. 4(a)) may be stacked to achieve higher orders of attenuation. Again, the image sensor is formed of an array of spatial pixels, each spatial pixel including multiple detector pixels having broadband optical filters with different transmittances.

In an alternative embodiment, the nanostructures of the third embodiment (FIGS. 4(a)-4(b)) may be combined with the metal or semiconductor wire grid structures of the first embodiment (FIGS. 2(a)-2(c)) or the second embodiment (FIGS. 3(a)-3(c)) to form a filter with improved spectral neutrality.

The broadband optical filter structures in the first to third embodiments can be conveniently integrated onto CMOS image sensor monolithically via commercially available CMOS process flow with virtually no extra cost.

Figure 5:
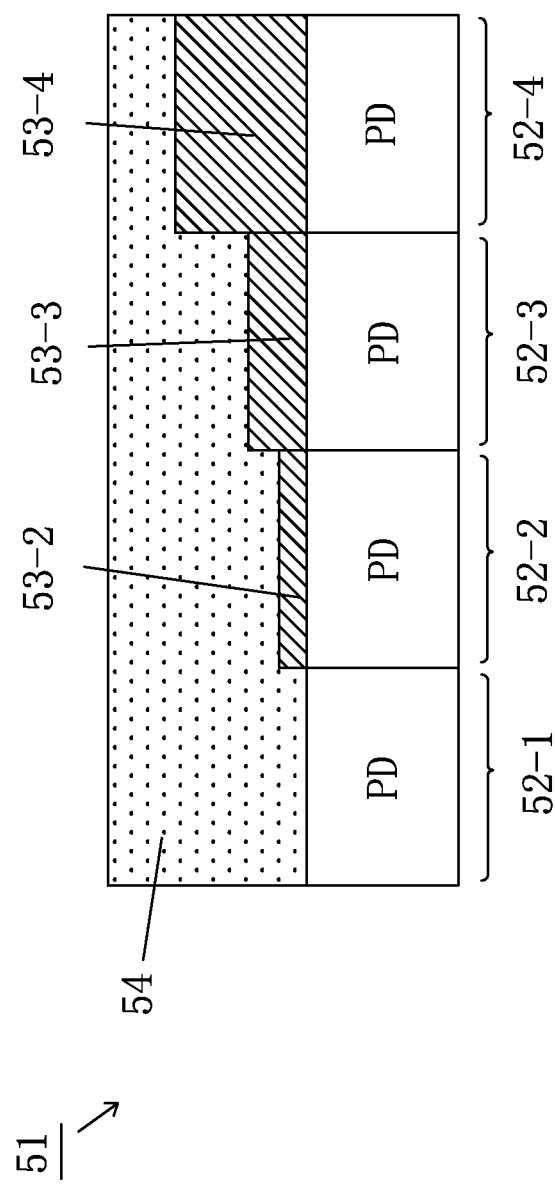
FIG. 5 schematically illustrates a high dynamic range image sensor employing metal or semiconductor layers of various thicknesses integrated with photodiodes according to a fourth embodiment of the present invention.

FIG. 5 illustrates a spatial pixel of a high dynamic range image sensor according to a fourth embodiment of the present invention. The spatial pixel 51 includes uniform metal or semiconductor layers with different thicknesses (including zero thickness) over the light intensity detector PD of different detector pixels 52-1 to 52-4. In the illustrated example, detector pixel 52-1 has no metal or semiconductor layer integrated above the light intensity detector PD, and detector pixels 52-2 to 52-4 respectively have metal or semiconductor layers 53-2 to 53-4 integrated above the PDs as broadband optical filters. Following the Lambert-Beer law, $I=I0*exp(-ax)$, where a is the absorption coefficient of the metal or semiconductor material and x is the thickness of the material, the light intensity reaching the detector PD through the metal or semiconductor layer decreases exponentially when the layer thickness increases.

Such a device may be fabricated by depositing a layer of metal or semiconductor material onto the photodiode; then, repeated lithography and etching steps may be used to generate material layers with different thicknesses on different photodiodes. The metal or semiconductor layers (or the photodiode without the material layer) is covered by a transparent dielectric (e.g. SiO2) cladding 54, with chemical-mechanical polishing to provide a flat finish for the subsequent deposition of microlens array and color filter array if needed.

Figure 6:
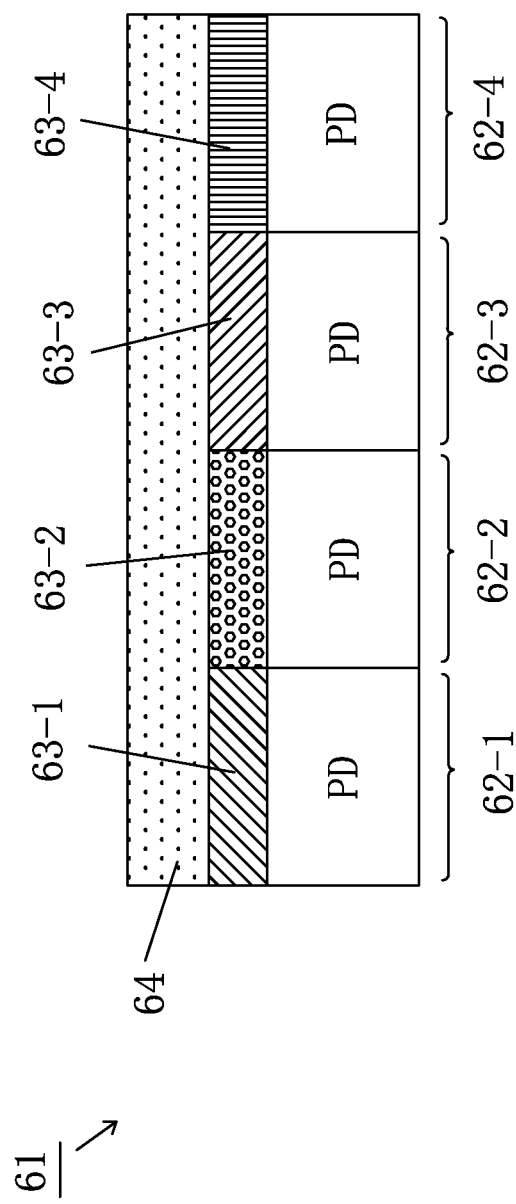
FIG. 6 schematically illustrates a high dynamic range image sensor employing metal or semiconductor layers of different materials integrated with photodiodes according to a fifth embodiment of the present invention.

FIG. 6 illustrates a spatial pixel of a high dynamic range image sensor according to a fifth embodiment of the present invention. The spatial pixel 61 includes uniform metal or semiconductor layers 63-1 to 63-4, which have different materials and identical thickness, over the light intensity detector PD of different detector pixels 62-1 to 62-4. The different materials result in different attenuation of the incident light. One method of fabricating the structure shown in FIG. 5(b) includes sequentially depositing and patterning the filter material on top of each detector pixel. The patterns can be defined by photolithography and transferred to the materials through dry etching or lift-off. The metal or semiconductor layers (or the photodiode without the material layer) is covered by a transparent dielectric (e.g. SiO2) cladding 64, with chemical-mechanical polishing to provide a flat finish for the subsequent deposition of microlens array and color filter array if needed.

In alternative embodiments, which combine characteristics of the fourth and fifth embodiments, the broadband optical filter over each detector pixel of the spatial pixel is a uniform material layer, and the different filters over different detector pixels may use different materials and have different thicknesses, or a combination thereof. For example, some of the filters may have identical material and different thicknesses, while some other filters may have identical thickness and different materials.

Figure 7:
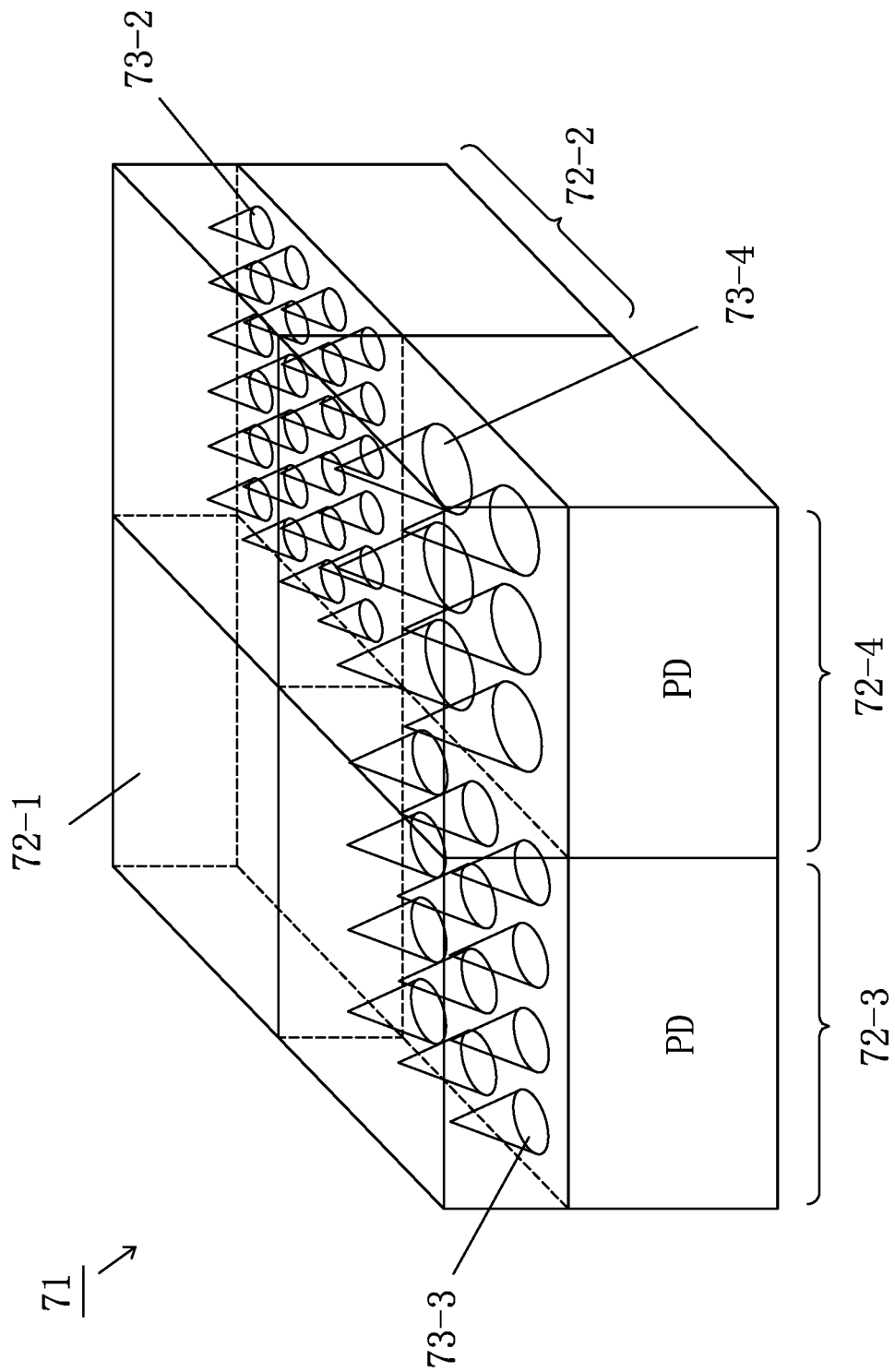
FIG. 7 schematically illustrates a high dynamic range image sensor employing nanocone arrays integrated with photodiodes according to a sixth embodiment of the present invention.

FIG. 7 illustrates a spatial pixel of a high dynamic range image sensor according to a sixth embodiment of the present invention. The spatial pixel 71 includes multiple detector pixels 72-1 to 72-4, each of which including a light intensity detector and a nanocone structure integrated over it to act as a broadband optical filter, or have no broadband optical filter. In the illustrated example, detector pixel 72-1 has no broadband optical filter, and the other three detector pixels respectively have filters 73-2 to 73-4. Nanocones have been proposed as a device for modulating the absorption and transmission of solar cells in the visible range. See, for example, K. Wang et al., Absorption Enhancement in Ultrathin Crystalline Silicon Solar Cells with Antireflection and Light-Trapping Nanocone Gratings, Nano Lett, 2012, 12 (3), pp 1616-1619. In the embodiment shown in FIG. 7, the nanocone structures in different detector pixels may have different geometries such as the diameter of the cone and the periodicity, which give rise to different light transmittances. The spatial pixels formed of such multiple detector pixels extend the dynamic range of the image sensor. In addition, multiple layers of nanocone structures can be manufactured layer by layer, or stacked with other structures such as 2D photonic crystals, to achieve desired transmittance for each detector pixel.

Figures 8A, 8B:
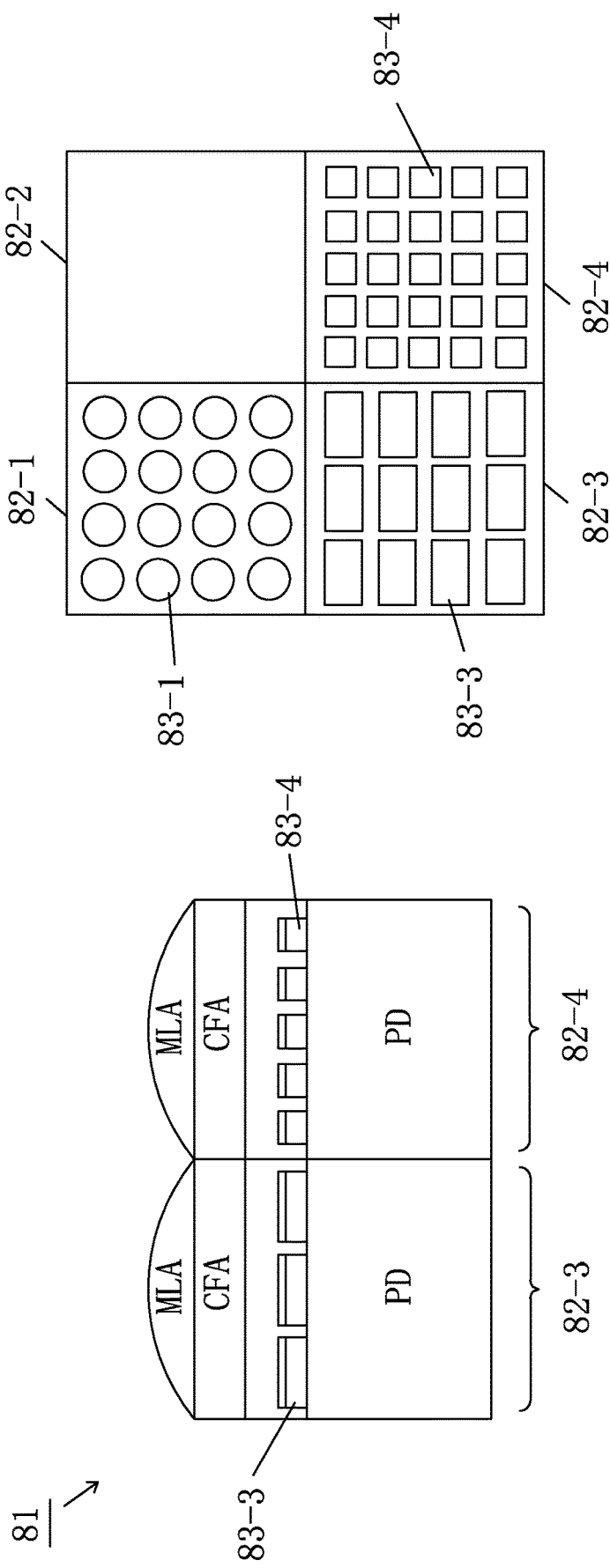
FIGS. 8(a) and 8(b) schematically illustrate a high dynamic range image sensor employing metamaterial structures integrated with photodiodes according to a seventh embodiment of the present invention.

FIGS. 8(a) and 8(b) illustrate a spatial pixel of a high dynamic range image sensor according to a seventh embodiment of the present invention. The spatial pixel 81 includes multiple detector pixels 82-1 to 82-4, each of which including a light intensity detector, a metamaterial structure integrated over it to act as a broadband optical filter, or have no broadband optical filter. In the illustrated example, detector pixel 82-2 has no broadband optical filter, and the other three detector pixels respectively have filters 83-1, 83-3 and 83-4. Metamaterial structures have been proposed as broadband optical filters for visible and NIR ranges. See, for example, J. Yoon et al., Broadband Epsilon-Near-Zero Perfect Absorption in the Near-Infrared, Scientific Reports volume 5, Article number: 12788 (2015); and L. Lei, Ultra-broadband absorber from visible to near-infrared using plasmonic metamaterial, OPTICS EXPRESS 5686-5693, Vol. 26, No. 5, 5 Mar. 2018. In the embodiment shown in FIGS. 8(a) and 8(b), the metamaterial structures in different detector pixels may have different geometries such as the periodicity and size of the features, which give rise to different light transmittances. The spatial pixels formed of such multiple detector pixels extend the dynamic range of the image sensor.

Figure 9B:
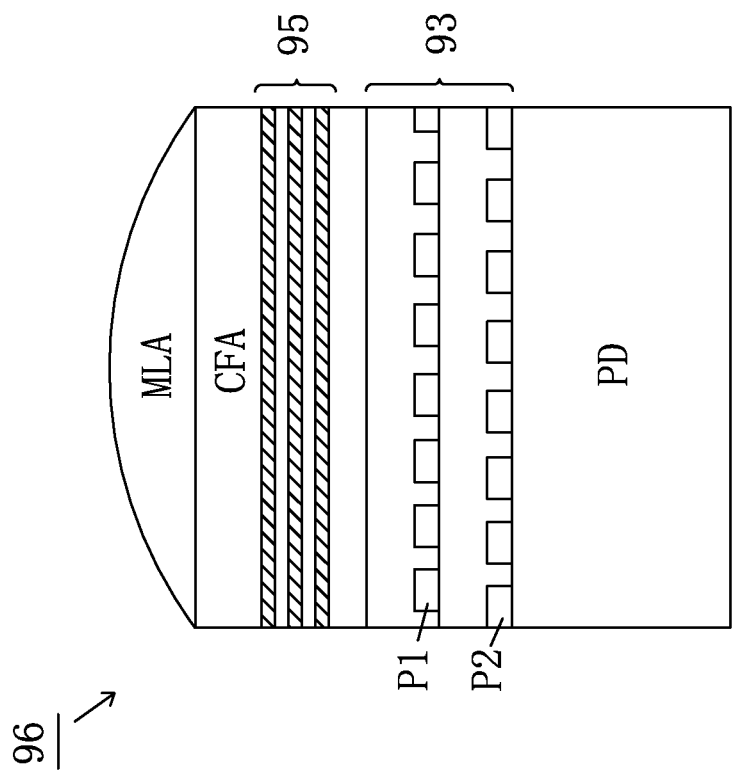
FIGS. 9(a)-9(b) schematically illustrate two high dynamic range image sensors which combine resonant nanostructures with broadband optical filters integrated with photodiodes according to alternative embodiments of the present invention.
Figure 9A:
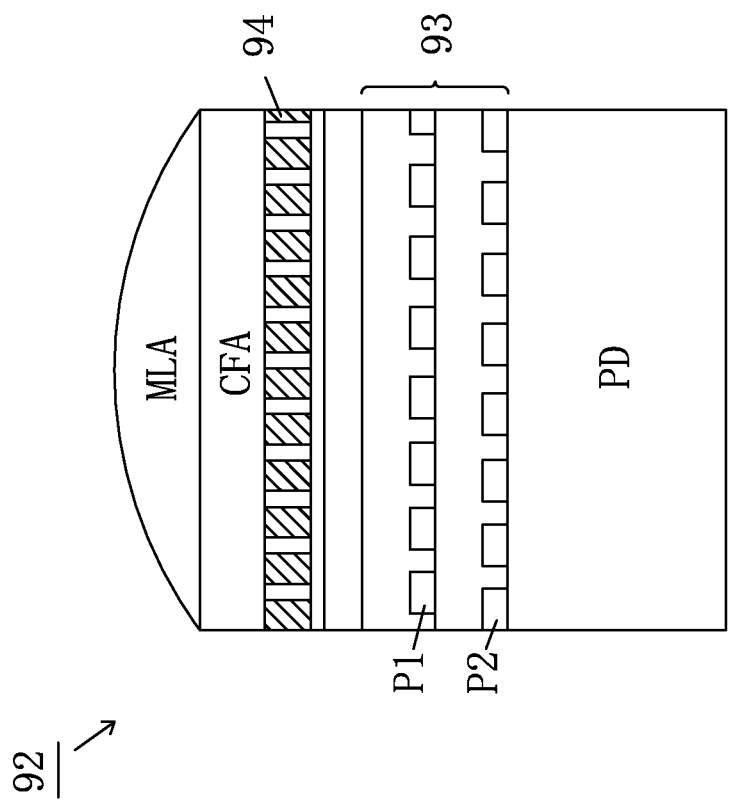

According to alternative embodiments of the present invention, each detector pixel of a high dynamic range image sensor includes a resonant nanostructure and a broadband optical filter such as those of the first to seventh embodiments. Resonant nanostructures can be useful for tuning the spectral response, suppressing undesired spectral bands, and improving the spectral neutrality. Examples of resonant nanostructures include 2D and 3D photonic crystals, Fabry-Perot structures with alternating layers of dielectric films, plasmonic nanostructures, nano-cones array, etc. FIGS. 9(a) and 9(b) show two examples of detector pixels 92 and 96, each formed by stacking a resonant nanostructure (2D photonic crystal 94 in FIG. 9(a) and Fabry-Perot films 95 in FIG. 9(b)) on top of a broadband optical filters 93. In the illustrated examples, the broadband optical filter 93 is the two-layer wire grid structure in the first embodiment (FIGS. 2(a)-2(c)).

The high dynamic range image sensor of the first to seventh embodiments can be used in both monochromatic image sensors and color image sensors. When used in color image sensors, each detector pixel is covered by a specific type of color filter, for example R (red), G (green) or B (blue), to detect only a portion of the visible spectrum. It is easier to optimize the nanostructure of the broadband optical filter to achieve relatively flat transmission spectrum in a smaller spectral window, thus relaxing the design constraint for the nanostructure. Thus, a larger number of different types of nanostructures may become suitable as broadband optical filters in such a high dynamic range image sensor. In this disclosure, an optical filter that has a relatively flat transmission spectrum in a small spectral window (and may have non-flat transmission spectrum elsewhere) is still referred to as a "broadband optical filter" when such a filter is used together with a color filter that transmits only in the small spectral window. In a color image sensor, multiple detector pixels having different broadband optical filters but the same type of color filter (e.g., R, G, or B) form a single-color spatial pixel, and multiple (e.g., three) single-color spatial pixels form a multi-color spatial pixel.

Figure 10:
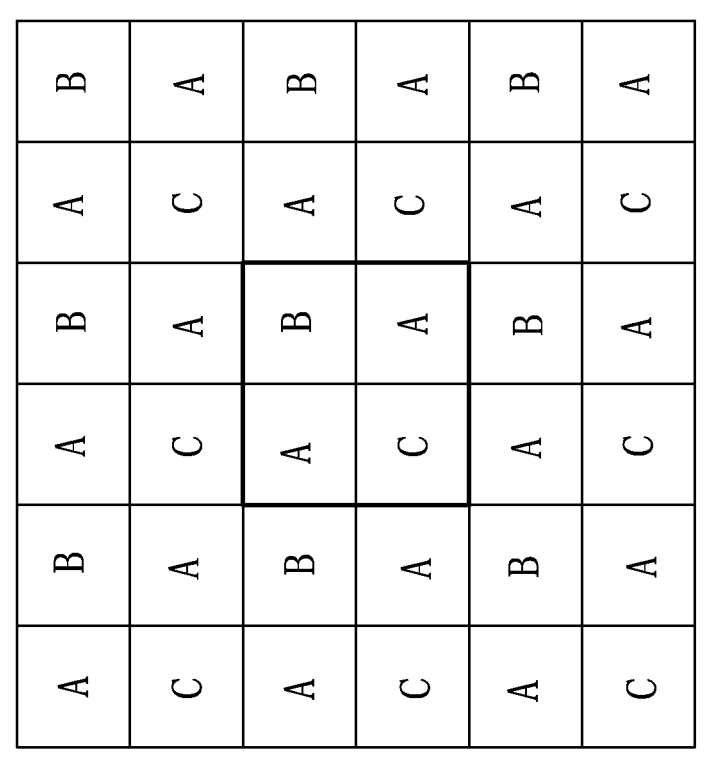

In the above-described embodiments, to extend the dynamic range of the image sensor, each spatial pixel includes at least two detector pixels, at least one of them having a broadband optical filter to attenuate the incident light. This leads to a reduction of spatial resolution of the image sensor. To restore the loss of spatial resolution, the image sensor uses a defined detector pixel arrangement, and algorithms are employed to process the data from the detector pixels. An example of the detector pixel arrangement, which is inspired by the Bayer layout of the RGB sensors (the RGBG pattern), is shown in FIG. 10. Three types of detector pixels are used; type A detector pixel has no broadband optical filters and therefore has the highest sensitivity to the incoming light; type B detector pixel has a broadband optical filter with a relatively low (e.g., 2 orders of magnitude) attenuation, and type C detector pixel has a broadband optical filter with a relatively high (e.g., 4 orders of magnitude) attenuation. A spatial pixel is a 2×2 array having two type A detector pixels located at diagonal positions, and one type B and one type C detector pixel located at the other diagonal positions. By performing demosaicing algorithms similar to demosaicing algorithms for the Bayer pattern of RGB sensors, the pixel value of different attenuations can be obtained and the spatial resolution of the image can be partially restored. Demosaicing algorithms for the Bayer pattern are generally known, and those skilled in the art can adapt them for demosaicing in the present embodiment without undue experimentation.

Figure 11:
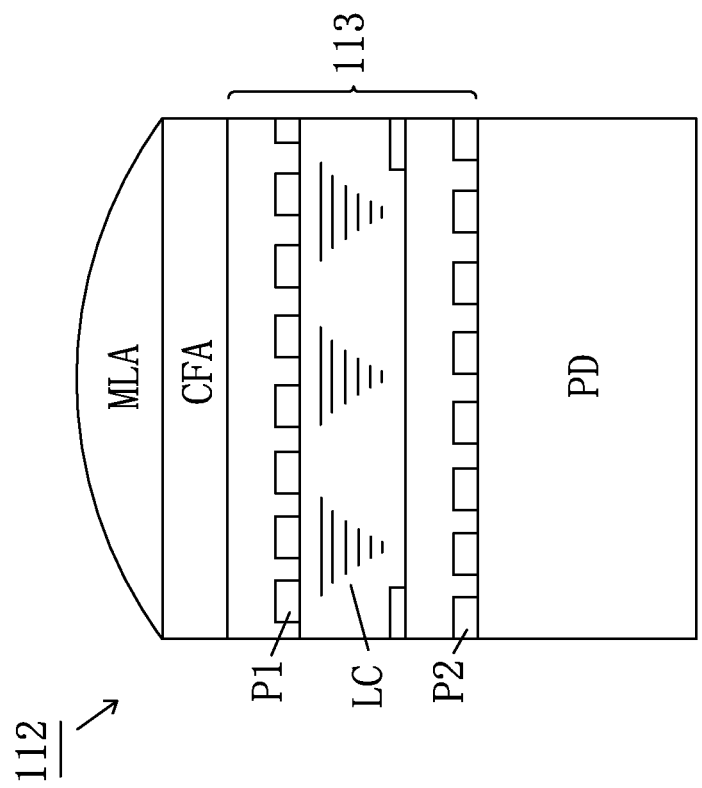
FIG. 11 schematically illustrate a high dynamic range image sensor employing tunable optical attenuators integrated with photodiodes according to a eighth embodiment of the present invention.

In an eighth embodiment of the present invention, shown in FIG. 11, the detector pixels of the high dynamic range image sensor employ tunable broadband optical filters based on polarization modulation. As shown in FIG. 11, the broadband optical filter 113 of the detector pixel 112 realizes the tunability of light transmittance by integrating a liquid crystal layer LC disposed between two wire grid polarizers P1 and P2 which are similar to those of the first embodiment. The orientations of the two wire grid polarizers P1 and P2 are preferably perpendicular to each other, but may also be at other angles relative to each other. The liquid crystal layer LC and the two wire grid structures P1, P2 are all integrated monolithically with the CMOS image sensor PD. The liquid crystal layer rotates the polarization direction of the light that travels between the first polarizer P1 and the second polarizer P2, thereby controlling the transmittance of the broadband optical filter 113. The rotation of the polarization direction can be tuned continuously from 0 to 90 degrees by controlling the electric field applied to the electrodes of the liquid crystal layer. As a result, the transmittance of the filter 113 can be tuned continuously to achieve a high dynamic range.

Figure 12:
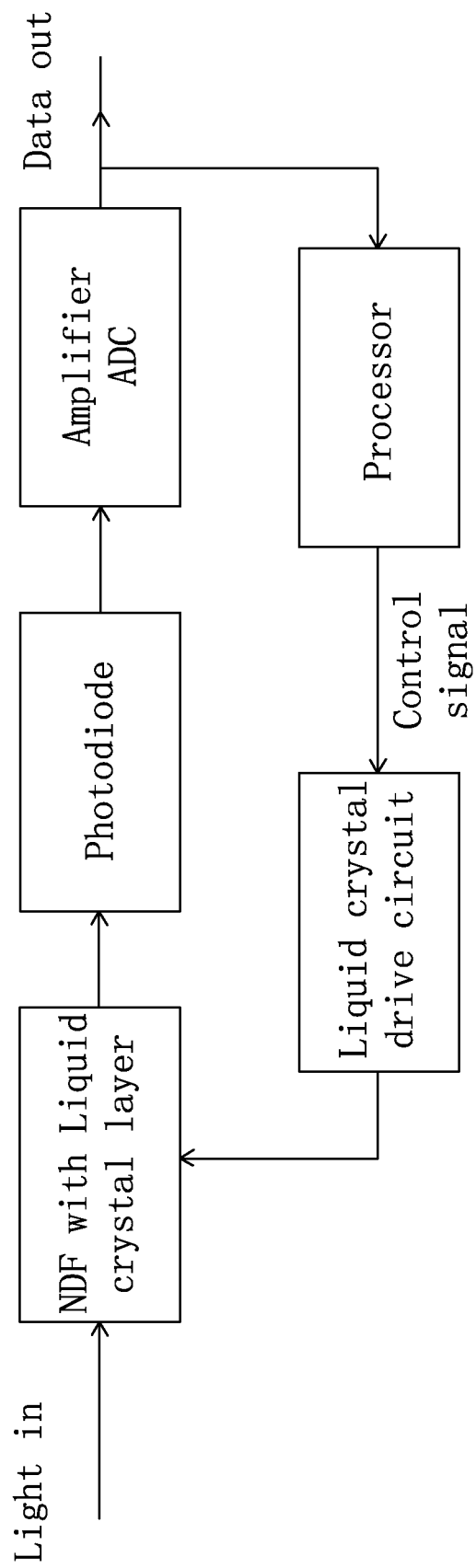
FIG. 12 schematically illustrate a feedback system for adaptive control of optical attenuators according to a ninth embodiment of the present invention.

Further, the liquid crystal layer may be adaptively controlled, i.e., controlled in response to the incident light intensity, to adaptively control the attenuation of the broadband optical filter 113. To achieve such adaptive control, in a ninth embodiment shown in FIG. 12, a negative feedback system is provided to generate control signal for the liquid crystal layer of each detector pixel. The feedback system utilizes the light intensity signals outputted by the light intensity detectors, after amplification and analog-to-digital conversion, to compute the amounts of attenuation to be applied to each detector pixels.

Figure 13:
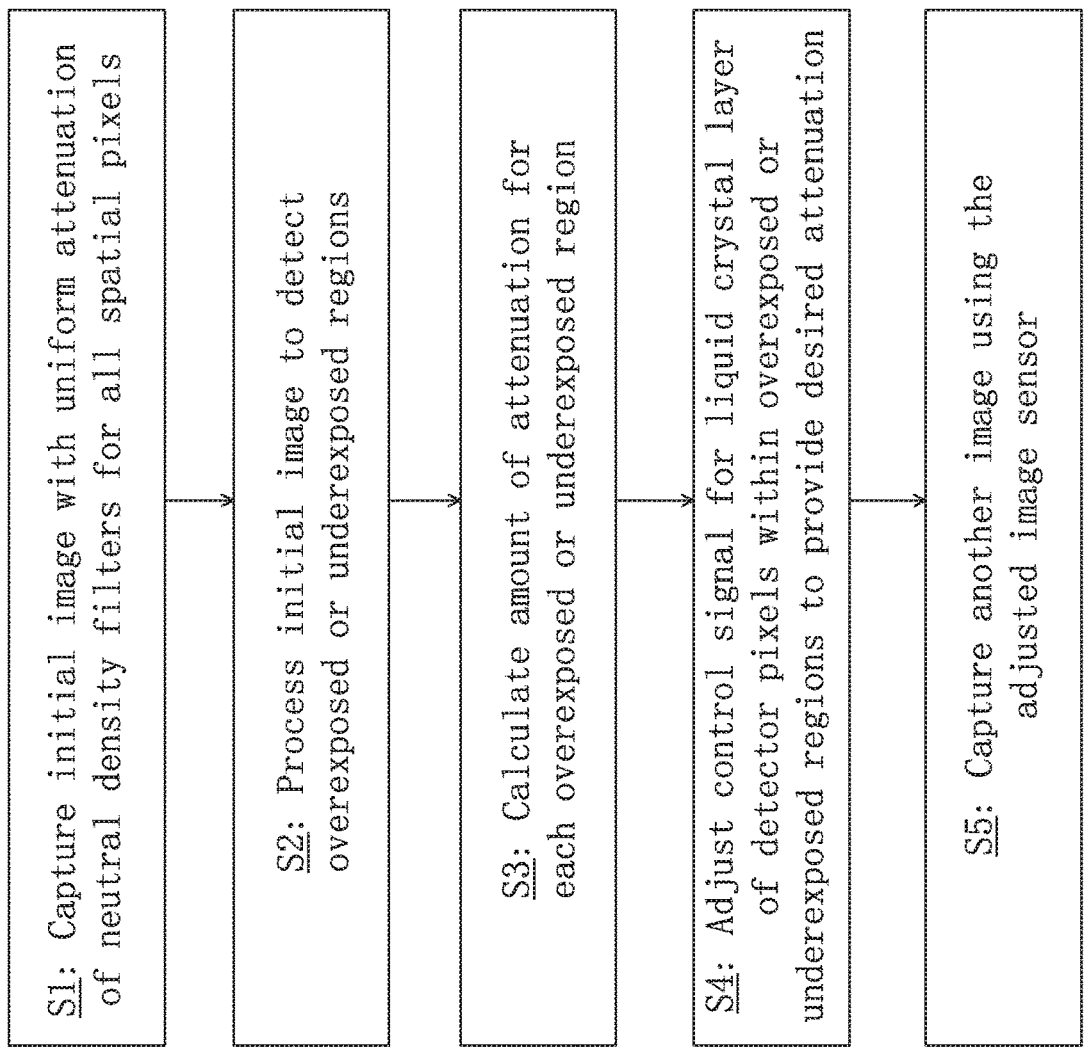
FIG. 13 schematically illustrate a method of operating a high dynamic range image generating method using adaptively controlled optical attenuators according to a tenth embodiment of the present invention.

A tenth embodiment of the present invention provides an adaptive control method using the feedback system to generate HDR images. In this embodiment, each spatial pixel may be a single detector pixel. As shown in FIG. 13, an initial image is first taken with a uniform attenuation (which may be zero) for all spatial pixels (step S1). The initial image is analyzed to detect regions in the image that are overexposed or underexposed (step S2). In step S2, an algorithm similar to that used in conventional HDR image processing may be used. Note that here, the regions that are determined to be under or overexposed have sizes much larger than a spatial pixel. Based on the amount of overexposure and underexposure detected for these regions, a desired attenuation for each over or underexposed region is calculated (step S3). For example, for an overexposed region, the amount of attenuation should be such that the region remains relatively bright but is not saturated; for an underexposed region, the amount of attenuation should be such that the region remains relatively dark but is not completely dark. Then, the control signal for the liquid crystal layers within each overexposed or underexposed region is adjusted to provide the desired amount of attenuation for that region (step S4). Another image is then captured using the adjusted image sensor (step S5). Steps S2-S5 may be repeated for additional iterations until no over or underexposed region remains. In this adaptive control method, the final image captured by the image sensor is a visually pleasing image similar to one created by conventional HDR image processing, where bright areas are no longer overexposed and darker areas are no longer underexposed.

The image data processing steps S2 and S3 may be performed by the processor executing software programs stored in a memory.

In the adaptive control process described above, the signals from the light intensity detectors are read out, amplified, and converted to digital data and then processed. This requires off-chip image processing by components outside of the image sensor chip. In alternative embodiments, the negative feedback system may be provided at the pixel level of the image sensor, so that the photodiode outputs are directly used to control the liquid crystal data lines, which avoids the extra read out time.

It will be apparent to those skilled in the art that various modification and variations can be made in the high dynamic range image sensors and related methods of the present invention without departing from the spirit or scope of the invention. Thus, it is intended that the present invention cover modifications and variations that come within the scope of the appended claims and their equivalents.

What is claimed is:

1. A high dynamic range image sensor comprising:
   a plurality of spatial pixels forming an array,
   wherein each spatial pixel includes a plurality of detector pixels disposed adjacent to each other, each detector pixel including a light intensity detector,
   wherein in each spatial pixel, at least some of the detector pixels each have a broadband optical filter disposed above the respective light intensity detector, and
   wherein each spatial pixel either includes at least one detector pixel without any broadband optical filter and at least one detector pixel with a broadband optical filter, or includes at least two detector pixels with respective broadband optical filters that have different transmittances, wherein each broadband optical filter includes a nanostructure formed of one or more layers of semiconductor, metal, and/or dielectric material and is integrated with the corresponding light intensity detector, wherein each broadband optical filter includes two wire grid polarizers stacked above the light intensity detector, each wire grid polarizer including a patterned layer of metal or semiconductor covered by a dielectric layer, wherein the patterned layer in each wire grid polarizer includes a set of straight wires disposed parallel to each other and extending in a defined orientation, and wherein the defined orientations of the two wire grid polarizers are at a predefined angle relative to each other.

2. The high dynamic range image sensor of claim 1, wherein the light intensity detector is a CMOS (complementary metal-oxide-semiconductor) sensor.

3. The high dynamic range image sensor of claim 1, wherein the set of wires in each wire grid polarizer form a periodic structure, wherein a pitch of the periodic structure and a width of the wires are less than 400 nm.

4. The high dynamic range image sensor of claim 1, wherein each spatial pixel includes at least two detector pixels each having the broadband optical filter, and wherein the broadband optical filters for the two detector pixels have different relative angles.

5. The high dynamic range image sensor of claim 1, wherein each spatial pixel includes a 2×2 array of detector pixels, including two detector pixels without any broadband optical filter located at diagonal positions of the 2×2 array, and two detector pixels having broadband optical filters with different transmittances located at remaining diagonal positions of the 2×2 array.

6. A high dynamic range image sensor, comprising:
a plurality of pixels forming an array, each pixel including a light intensity detector and a broadband optical filter disposed above and integrated with the light intensity detector, wherein the broadband optical filter includes two wire grid polarizers and a liquid crystal layer disposed between the two wire grid polarizers, wherein each wire grid polarizer includes a patterned layer of metal or semiconductor covered by a dielectric layer, the patterned layer including a set of straight wires disposed parallel to each other and extending in a defined orientation;

a liquid crystal drive circuit configured to apply an electric field to the liquid crystal layer of each pixel, wherein in response to the electric field, the liquid crystal layer rotates a polarization direction of the light passing through it to change a transmittance of the broadband optical filter; and a control circuit configured to generate control signals for the drive circuit, wherein the control circuit includes a processor configured to receive image signals output by the light intensity detectors, and to generate the control signals in response to the image signals, including to:

analyze the image signals output by the light intensity detectors to identify regions of the image that are overexposed or underexposed; and generate the control signals based the identified regions, the control signals configured to cause the broadband optical filters of pixels located in overexposed regions to have lower transmittances and to cause the broadband optical filters of pixels located in underexposed regions to have higher transmittances.

7. The high dynamic range image sensor of claim 6, wherein the light intensity detector is a CMOS (complementary metal-oxide-semiconductor) sensor.

* * * * *